United States Patent
Lee et al.

(10) Patent No.: US 8,999,863 B2
(45) Date of Patent: Apr. 7, 2015

(54) STRESS LINER FOR STRESS ENGINEERING

(75) Inventors: Jae Gon Lee, Singapore (SG); Jingze Tian, Singapore (SG); Shyue Seng Tan, Singapore (SG); Luona Goh, Singapore (SG); Wei Lu, Singapore (SG); Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 219 days.

(21) Appl. No.: 12/133,375

(22) Filed: Jun. 5, 2008

(65) Prior Publication Data

US 2009/0302391 A1    Dec. 10, 2009

(51) Int. Cl.
  *H01L 27/092*  (2006.01)
  *H01L 21/8238*  (2006.01)
  *H01L 29/78*  (2006.01)
  *H01L 29/66*  (2006.01)

(52) U.S. Cl.
  CPC .... *H01L 21/823807* (2013.01); *H01L 29/7843* (2013.01); *H01L 29/665* (2013.01)

(58) Field of Classification Search
  USPC ................... 257/178, 414, 669, 369
  See application file for complete search history.

(56) References Cited

U.S. PATENT DOCUMENTS

| 6,939,814 | B2 | 9/2005 | Chan et al. | |
| 7,763,509 | B2 * | 7/2010 | Pidin et al. | 438/199 |
| 2005/0093081 | A1 * | 5/2005 | Belyansky et al. | 438/291 |
| 2005/0247926 | A1 * | 11/2005 | Sun et al. | 257/19 |
| 2006/0011984 | A1 * | 1/2006 | Currie | 438/517 |
| 2006/0105516 | A1 * | 5/2006 | Belyansky et al. | 438/199 |
| 2006/0157795 | A1 * | 7/2006 | Chen et al. | 438/199 |
| 2006/0244074 | A1 * | 11/2006 | Chen et al. | 257/371 |
| 2008/0044967 | A1 * | 2/2008 | Teh et al. | 438/199 |

* cited by examiner

*Primary Examiner* — David Vu
*Assistant Examiner* — Jonathan Han
(74) *Attorney, Agent, or Firm* — Horizon IP Pte. Ltd.

(57) ABSTRACT

A stress liner having first and second stress type is provided over a first type and a second type transistor to improve reliability and performance without incurring area penalties or layout deficiencies.

24 Claims, 8 Drawing Sheets

STRESS LINER FOR STRESS ENGINEERING

BACKGROUND

Integrated circuits (ICs) typically comprise numerous circuit components, such as transistors, resistors and capacitors, interconnected to perform the desired functions. Strain generation in silicon has been proposed to improve carrier mobility of transistors which decreases trapped charges in the gate oxide. Stress inducing liners are used to induce stress. However, hot electrons are more mobile than hot holes. To compensate for the differences in mobility, different stresses are applied to the p-type and n-type transistors. Dual stress inducing liners can be used to induce different stresses in respective p-type and n-type transistors. For example, a compressive stress inducing nitride liner is provided over the p-type transistors while a tensile stress inducing nitride liner is provided over the n-type transistors.

Typically, one liner overlaps the other liner to ensure that no gaps exist between the two liners. At the region where the liners overlap, the thickness is about double that of the non-overlapping regions. The non-uniformity in thickness between the overlap and non-overlap regions creates problems in subsequent processes, which can lead to decreased reliability. Furthermore, typical dual liner processes involve use of more than one mask, for example two masks, during processing. This leads to process cost and product yield concerns.

From the foregoing discussion, it is desirable to provide improved dual liners which increase reliability as well as performance of ICs.

SUMMARY

Embodiments are generally related to semiconductor devices or integrated circuits. In one embodiment, a method of stress engineering is disclosed. The method comprises providing a substrate having first and second regions. A stress liner is deposited on the substrate. The stress liner is formed from a material having a first stress. A first portion of the stress liner over the first region is processed to convert the stress material to a second stress.

Another embodiment relates to a method of fabricating an IC. The method comprises providing a substrate having first and second active regions defined thereon. The first active region comprises a first transistor of a first type and the second active region comprises a second transistor of a second type. A stress liner is formed on the substrate covering the first and second transistors, wherein the stress liner comprises a first stress. The first portion of the stress liner over the first transistor is processed to transform the first stress of the stress liner to a second stress.

An IC that includes a first transistor of a first type on a first active region of a substrate and a second transistor of a second type on a second active region of the substrate is disclosed. A stress liner is disposed on the substrate and covers the transistors. The stress liner comprises a first portion with a first stress covering the first transistor and a second portion with a second stress covering the second transistor.

These and other objects, along with advantages and feature of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which.

DETAILED DESCRIPTION

Embodiments generally relate to semiconductor devices or ICs. The devices or ICs can be any type of device or IC, such as memory devices including dynamic random access memories (DRAMs), static random access memories (SRAMs), non-volatile memories including programmable read-only memories (PROMs) and flash memories, optoelectronic devices, logic devices, communication devices, digital signal processors (DSPs), microcontrollers, system-on-chip, as well as other types of devices. Such devices or ICs can be incorporated in various types of products, for example, computers and communication devices or systems such as phones and personal digital assistants (PDAs). Although embodiments are generally described in the context of semiconductor devices or ICs, other types of devices are also useful.

Figure 1:
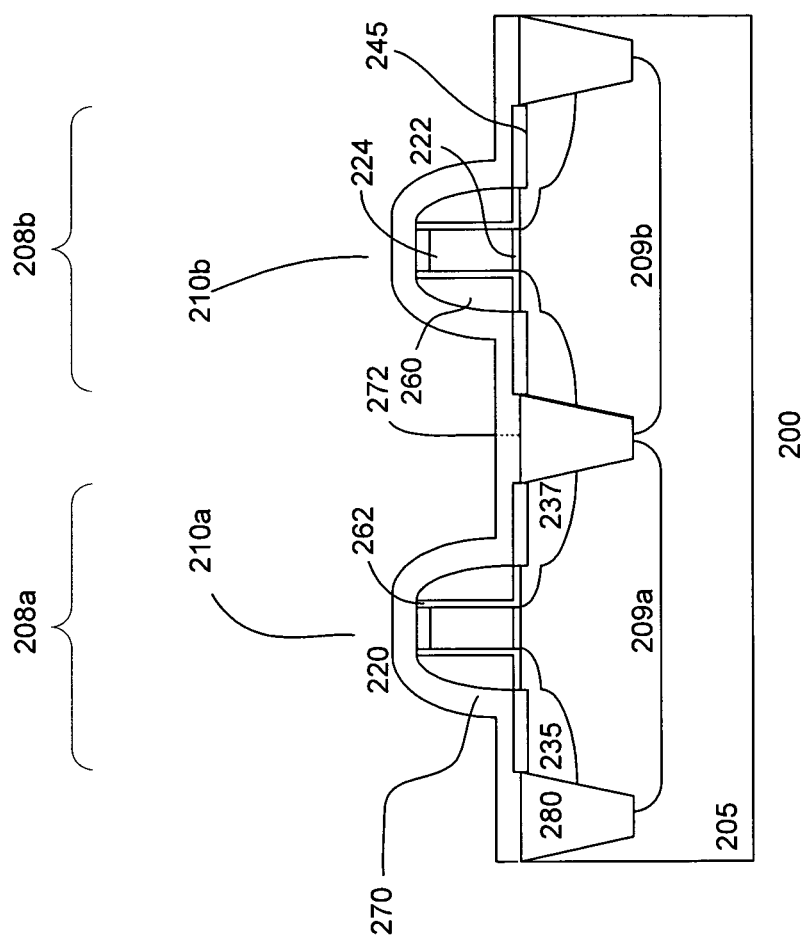
FIG. 1 shows a cross sectional view of a portion of an IC in accordance with one embodiment of the invention.

FIG. 1 shows a cross-sectional view of a portion of an IC 200 in accordance with one embodiment of the invention. The portion includes a substrate 205. The substrate comprises, for example, a silicon substrate. The silicon substrate is typically lightly doped with p-type dopants. Other types of substrates, such as silicon-on-insulator (SOI), silicon germanium, are also useful. The substrate is prepared with first and second active regions 208a-b. The active regions comprise heavily doped regions 209a-b with dopants of opposite polarity types. For example, the first active region is a p-type doped well; the second active region is a n-type doped well. P-type dopants can include boron (B), aluminum (Al) or a combination thereof while n-type dopants can include phosphorus (P), arsenic (As), antimony (Sb) or a combination thereof.

Isolating the active regions from each other and other device regions on the substrate are isolation regions 280. The isolation regions, for example, comprise STI regions. Other types of isolation regions are also useful.

The active regions comprise first and second transistors 210a-b. The first transistor comprises a first type transistor and the second transistor comprises a second type transistor. In one embodiment, the first transistor comprises a n-type transistor on the p-type doped well and the second transistor comprises a p-type transistor on a n-type doped well. A transistor includes a gate or gate stack 220. The gate stack, for example, includes a gate electrode 224 over a gate dielectric 222. Typically, the gate electrode comprises polysilicon (doped or undoped) while the gate dielectric comprises silicon oxide. Other types of gate electrode or dielectric material are also useful.

The gate stack includes dielectric spacers on the gate sidewalls. The dielectric spacers comprise, for example, a dielectric material such as oxide and/or nitride. Other types of dielectric materials are also useful. In one embodiment, each dielectric spacer comprises a L-shaped silicon oxide liner 262 on which a silicon nitride spacer 260 is disposed. Other types of spacers or spacer designs are also useful.

First and second source/drain (SD) diffusion regions 235 and 237 are provided in the substrate adjacent to the gates. In one embodiment, a diffusion region includes a shallow SD extension portion and a deep SD portion. For p-type transistors, the diffusion regions comprise p-type dopants while n-type dopants are used for n-type transistors.

Metal silicide contacts 245 can be provided on the surface of the diffusion regions and gate stack. The silicide contacts serve to reduce sheet resistance. Various types of metal silicide contacts can be used, such as nickel or nickel-alloy silicide contacts. Other type of metal silicide contacts can also be useful.

Although only one transistor is shown in each active region, it is understood that in an IC there are typically numerous transistors in an active region. For example, an active region can include densely populated (nested) or less densely populated (iso) transistors, or a combination of both. Typically, adjacent nested transistors share a common SD diffusion region. Furthermore, there may also be numerous first and second type active regions.

In accordance with one embodiment of the invention, a stress liner 270 is provided on the substrate. The stress liner comprises first and second stress portions. In one embodiment, the stress liner comprises first and second portions covering first and second transistors. The first and second portions have different stresses. For example, the first portion comprises a tensile stress while the second portion comprises a compressive stress. The tensile stress portion improves carrier mobility of the n-type transistors while the compressive stress improves carrier mobility of the p-type transistors.

The first and second portions of the stress liner, when deposited, comprise the same material. The stress liner, in one embodiment, comprises a material having a first stress. One portion of the stress liner is treated to produce a second stress while the untreated portion is maintained at the first stress. The respective stress of the different portions improves carrier mobility of the different transistors. In one embodiment, the stress liner comprises a compressive stress material. A first portion covering the n-type transistor is treated to convert it into a tensile stress material while leaving the second untreated portion with compressive stress. The stress liner, in one embodiment, comprises silicon nitride. Other types of materials are also useful. By providing a single stress layer with first and second stress portions, a smooth interface 272 between the portions results without complex processing which is required in conventional dual stress liners. As shown, the interface is located at the isolation region between the active regions.

A premetal dielectric (PMD) layer (not shown) can be provided over the substrate, separating the substrate and transistor from a metal layer. The PMD layer comprises, for example, silicon oxide. Other types of dielectric materials, such as silicon nitride, are also useful. Via plugs (not shown) are provided in the PMD layer which are coupled to metal lines of a metal layer (not shown) over the PMD layer. The plugs and metal lines form interconnections as desired.

Figure 2A:
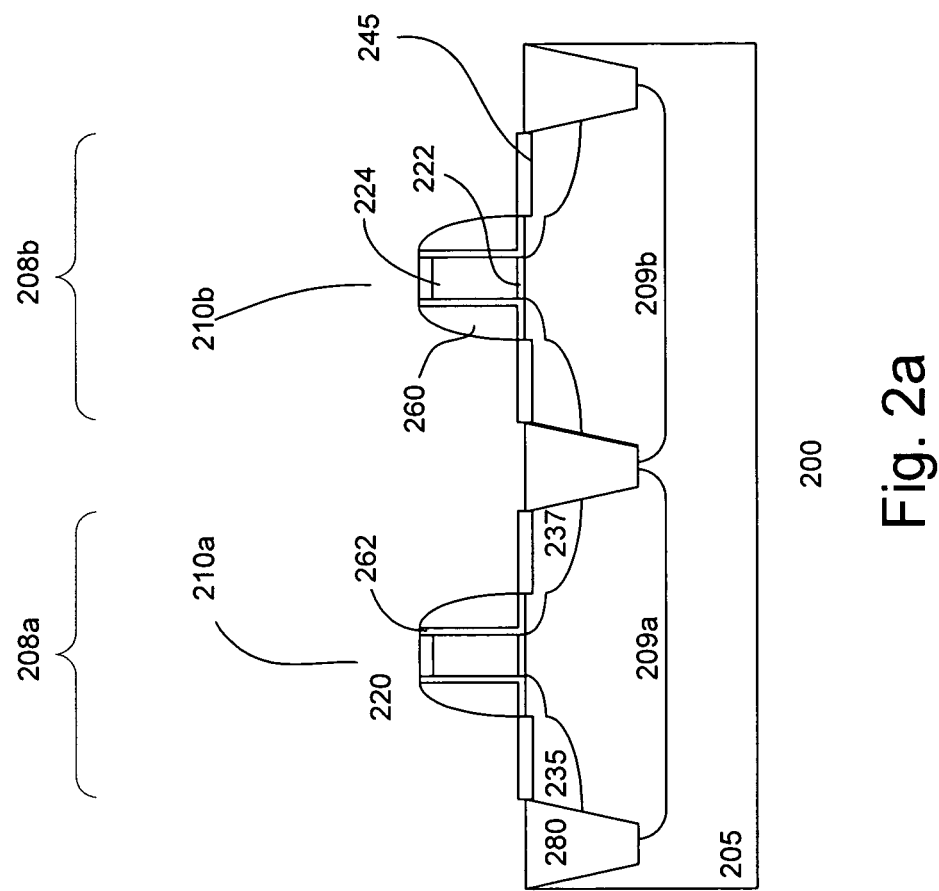
FIGS. 2a-e illustrate an embodiment of a process for forming an IC.

FIGS. 2a-e show cross-sectional views of a process for forming an IC 200 in accordance with one embodiment of the invention. Referring to FIG. 2a, a substrate 205 is provided. The substrate can comprise a silicon substrate, such as a lightly doped p-type substrate. Other types of substrates, including silicon-on-insulator (SOI) or silicon germanium, are also useful. The substrate is prepared with first and second active regions 208a-b. The active regions comprise heavily doped regions 209a-b with dopants of opposite polarity types. For example, the first active region includes a p-type doped well; the second active region includes a n-type doped well. P-type dopants can include boron (B), aluminum (Al) or a combination thereof while n-type dopants can include phosphorus (P), arsenic (As), antimony (Sb) or a combination thereof. To form the active regions, conventional ion implantation techniques, such as implantation with a mask can be used. Generally, the first and second types of active regions are formed in separate processes. Other techniques for forming the active regions are also useful.

The substrate is also prepared with isolation regions 280 to separate the active regions from each other and other active device regions. In one embodiment, the isolation regions comprise STIs. Various conventional processes can be employed to form the STI regions. For example, the substrate can be etched using conventional etch and mask techniques to form trenches which are then filled with dielectric material such as silicon oxide. Chemical mechanical polishing (CMP) can be performed to remove excess oxide and provide a planar substrate top surface. The STI regions can be formed, for example, prior to or after the formation of the doped wells. Other processes or materials can also be used to form the STIs.

Transistors 210a-b are prepared in the first and second active regions. A first transistor is formed in the first active region and a second transistor is formed in the second active region. In one embodiment, the first transistor comprises a n-type transistor formed in a p-type well and the second transistor comprises a p-type transistor formed in a n-type well.

A transistor includes a gate or gate stack 220. The gate stack, for example, includes a gate electrode 224 over a gate dielectric 222. Typically, the gate electrode comprises polysilicon (doped or undoped) while the gate dielectric comprises silicon oxide. Other types of gate electrode or dielectric materials are also useful. Conventional processes can be used to form the gate stacks of the transistors. For example, gate stack layers such as gate dielectric and gate electrode are sequentially formed on the substrate. The gate stack layers are patterned to form the gate stacks. To pattern the gate stack layers, mask and etch processes can be used. The gate stack layers can be patterned to form gate conductors. A gate conductor serves as a common gate for a plurality of transistors.

The gate stack includes dielectric spacers on the gate sidewalls. The dielectric spacers comprise, for example, a dielectric material such as oxide and/or nitride. Other types of dielectric materials are also useful. In one embodiment, each dielectric spacer comprises a L-shaped silicon oxide liner 262 on which a silicon nitride spacer 260 is disposed. Other types of spacers or spacer designs are also useful. Forming the spacers can include forming a first and second dielectric layer and patterning them to form the spacers.

First and second source/drain (SD) diffusion regions 235 and 237 are provided in the substrate adjacent to the gates. The doped regions are formed by ion implantation. The implant can be self-aligned or formed using an implant mask. Other techniques for forming the diffusion regions are also useful. For p-type transistors, the diffusion regions comprise p-type dopants while n-type dopants are used for n-type transistors. The p-type and n-type diffusion regions are formed in separate implantation processes.

In one embodiment, a diffusion region includes a shallow SD extension portion and a deep SD portion. For example, shallow SD extension portions are formed after the gates are patterned and the deep SD portions are formed after spacer formation. After the formation of diffusion regions, the dopants are activated by, for example, an annealing process. The annealing also serves to facilitate recovery from any deformation to the crystal structure incurred during the process of ion implantation. Various types of annealing, such as rapid thermal annealing, spike annealing, laser spike annealing or flash lamp anneal can be used. The anneal, for example, can be performed at about 950-1300° C.

Metal silicide contacts 245 can be provided on the surface of the diffusion regions and gate stacks. The silicide contacts serve to reduce sheet resistance. Various types of metal silicide contacts can be used, such as nickel or nickel-alloy silicide contacts. Other types of metal silicide contacts are also useful. To form metal silicide contacts, a metal layer is formed over the substrate. The metal layer is processed by annealing, causing a reaction with the silicon and metal to form metal silicide contacts in the diffusion regions and gate electrode. In one embodiment, a rapid thermal anneal at a temperature of about 400-500° C. in a $N_2$ ambient for about 5-10 sec is employed. Other process parameters may also be useful. Untreated or excess metal is removed, leaving the metal silicide contacts.

As discussed, an active region can include numerous transistors. For example, an active region can include densely populated (nested) or less densely populated (iso) transistors or a combination of both. Typically, adjacent nested transistors share a common S/D diffusion region. Furthermore, there may also be numerous first and second type active regions.

Figure 2B:
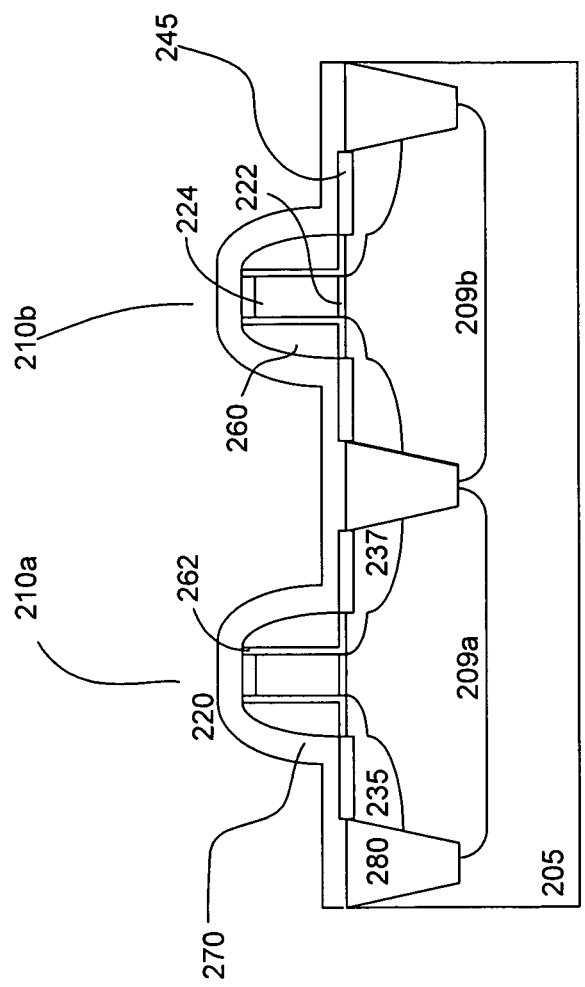

Referring to FIG. 2b, the process continues by depositing a stress liner 270 over the substrate. The stress liner covers the transistors in the first and second active regions. In one embodiment, the stress liner comprises a first stress. The first stress, in one embodiment, comprises compressive stress. The stress liner, for example, can be silicon nitride. Other types of stress inducing materials are also useful. Various techniques, such as CVD, can be used to form the stress layer. Preferably, the stress liner is formed by PECVD at a temperature of about 400-500° C. Typically, the stress layer is about 300-700° Å thick. Forming the stress layer with other thicknesses is also useful.

Figure 2C:
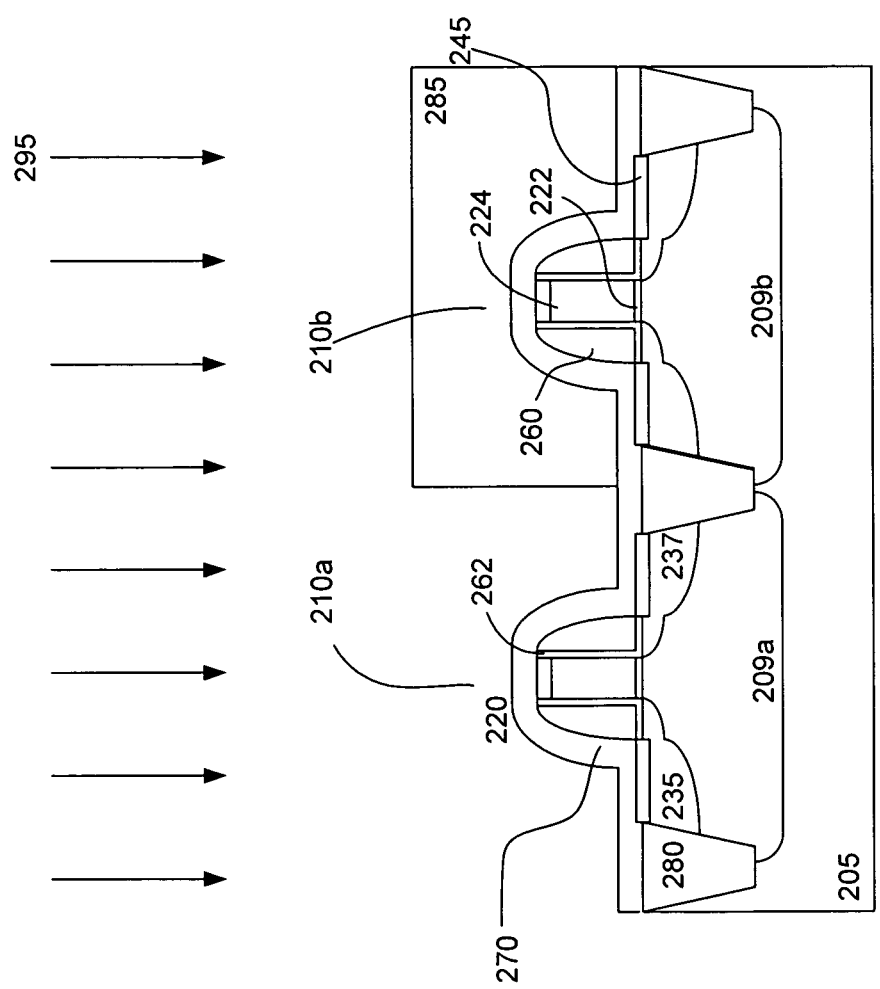

In FIG. 2c, a mask layer 285 is formed on the substrate and patterned to expose one of the active regions. The mask layer can comprise photoresist. Other types of mask materials are also useful. In one embodiment, the mask is patterned to expose a first portion of the stress layer over the first active region for treatment to alter the stress characteristics of that portion of the stress layer. Conventional techniques, such as exposure and development, may then be used to pattern the photoresist layer.

In one embodiment, a stress relaxation treatment 295 is performed on the stress liner. The stress relaxation treatment comprises, in one embodiment, first and second processes. The first process comprises implanting the exposed first portion of the stress liner with stress relaxing ions. The ions, for example, comprise Ge, Xe or a combination thereof. The implant dose, for example, can be about 1e14-5e15 ions/cm$^2$ at about 30~70 keV. The mask protects the second portion of the stress layer over the second active region from being affected by the relaxation treatment. The relaxation treatment relaxes or reduces the stress in the first portion of the stress liner.

Figure 2D:
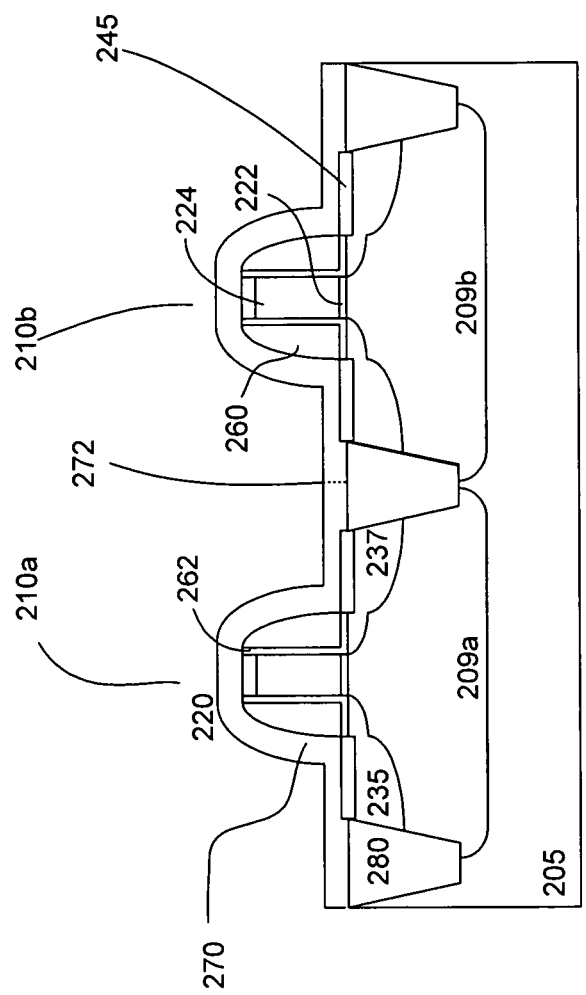

After ion implantation, the mask layer is removed from the second portion of the stress liner, as shown in FIG. 2d. The stress liner is then further treated with a second stress relaxing treatment to cause the first portion with stress relaxing ions to produce a second stress. In one embodiment, the stress liner is further treated to produce a tensile stress in the first portion, while the second portion is maintained at a compressive stress. The tensile stress, for example, is about 0.5 GPa. In one embodiment, the second treatment comprises UV treatment. The UV treatment, for example, is performed at about 400-500° C. for about 10 min to 1 hour. As described, the stress liner is treated with the second stress treatment without having a mask layer over the second portion. By providing a single stress layer with first and second stress portions, a smooth interface 272 between the portions is obtained without complex processing which is required in conventional dual stress liners. The interface is located at the isolation region between the active regions.

Figure 2E:
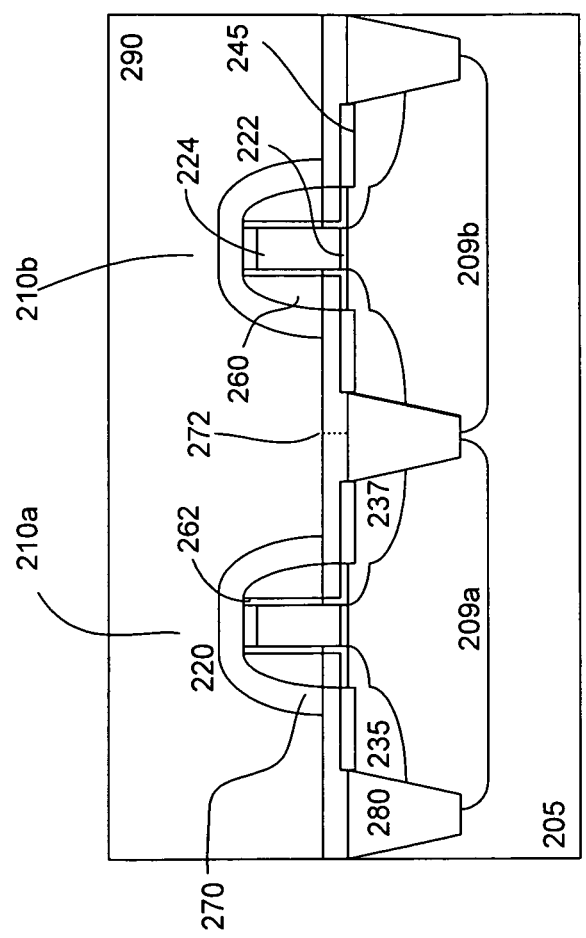

As shown in FIG. 2e, a PMD layer 290 is deposited over the substrate. The PMD layer serves as an interlevel dielectric layer between the substrate and a metal layer above the PMD layer. The process continues by forming interconnections to the contacts of the transistors. For example, the PMD layer is patterned to create vias and trenches. The vias and trenches are then filled with conductive material, such as copper, to form interconnects. Additional processes are performed to complete the IC, for example, additional interconnect levels, final passivation, dicing, and packaging.

Figure 3:
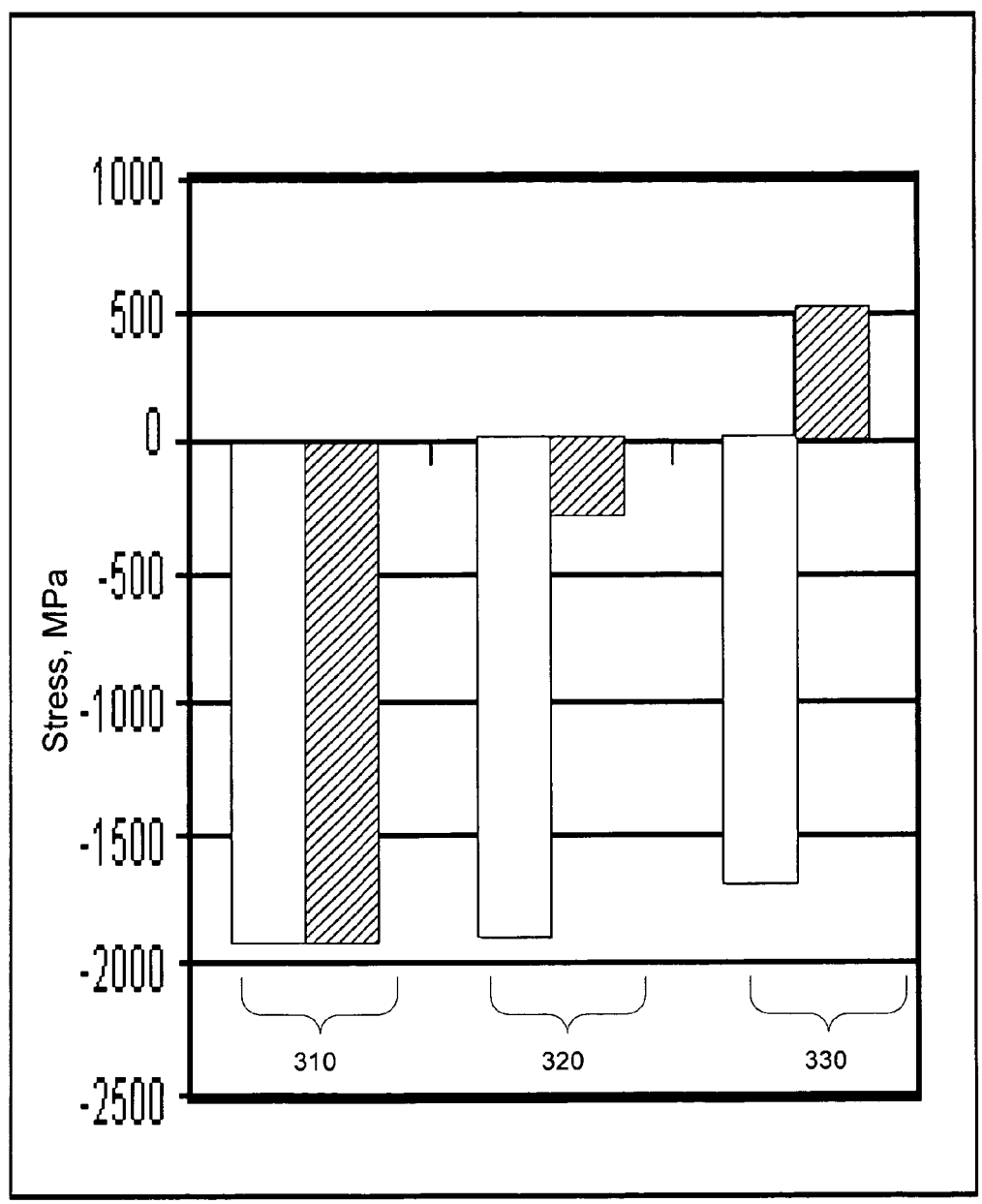
FIG. 3 shows stress characteristic variations during relaxation implantation and after UV treatment.

FIG. 3 shows a plot 300 of an experiment conducted to compare stress characteristics of a compressive silicon nitride film and one that has been treated in accordance with one embodiment of the invention. The shaded bars correspond to the compressive silicon nitride film with treatment and the un-shaded bars correspond to the untreated compressive silicon nitride film. As indicated by graph 310, the as deposited silicon nitride films have a compressive stress of about −1.9 GPa. After implantation with Ge or Xe, the treated film is relaxed to about −0.2 GPa while the untreated film is maintained at about −1.9 GPa, as indicated by graph 320. Graph 330 shows the stress characteristics of the films after UV treatment. The treated silicon nitride film has a stress of 0.5 GPa (e.g., tensile stress). The untreated silicon nitride film is slightly relaxed to about −1.8 GPa after UV treatment.

Figure 4:
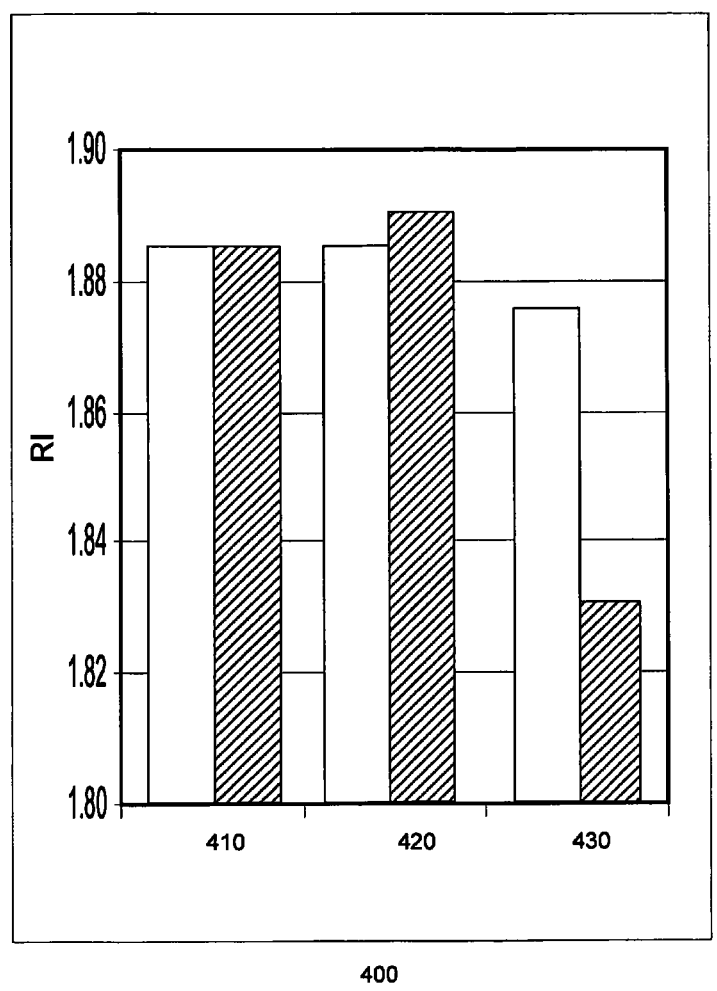
FIG. 4 shows variations in reflective index correlating to the stress characteristic variations.

It is believed that the change in stress is attributed to film shrinkage based on reflective index. Implanting the film with relaxing ions causes the film to shrink a greater amount when exposed to UV. FIG. 4 shows a plot 400 comparing the reflective index of a treated and untreated compressive silicon nitride film. The shaded bars correspond to the compressive silicon nitride film with treatment and the un-shaded bars correspond to the untreated compressive silicon nitride film. As indicated by graphs 410, 420 and 430, the UV causes the treated film to have a lower reflective index, evidencing a greater amount of shrinkage.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of fabricating an IC comprising:
    providing a substrate having first and second active regions defined thereon, the first active region comprises a first transistor of a first type and the second active region comprises a second transistor of a second type;
    forming a continuous first stress liner on the substrate covering the first and second transistors, wherein the continuous first stress liner comprises a first stress;
    forming a mask to protect a second portion of the continuous first stress liner in the second active region while leaving a first portion of the continuous first stress liner in the first active region exposed;

performing a first stress treatment, the first stress treatment is performed selectively on the first portion of the continuous first stress liner, the first treatment transforms the first stress in the first portion to a second stress while the mask protects the second portion of the continuous first stress liner in the second active region from the first stress treatment;

removing the mask over the second portion of the continuous first stress liner; and after removing the mask, performing a second stress treatment, the second stress treatment is performed non-selectively on both the first and second portions of the continuous first stress liner, the second treatment transforms the second stress in the first portion of the continuous first stress liner to a third stress.

2. The method of claim 1 wherein the first type comprises n-type and the second type comprises p-type.

3. The method of claim 2 wherein:
the first stress comprises tensile stress; and
the third stress comprises compressive stress, wherein the second stress is between the first and third stresses.

4. The method of claim 1 wherein the first type comprises p-type and the second type comprises n-type.

5. The method of claim 4 wherein:
the first stress comprises compressive stress; and
the third stress comprises tensile stress, wherein the second stress is between the first and third stresses.

6. The method of claim 1 wherein:
the first stress comprises compressive stress and the third stress comprises tensile stress; or
the first stress comprises tensile stress and the third stress comprises compressive stress; and
wherein the second stress is between the first and third stresses.

7. The method of claim 1 wherein the first treatment comprises implanting the first portion with stress relaxing ions.

8. The method of claim 7 wherein the stress relaxing ions comprises Ge, Xe or a combination thereof.

9. The method of claim 1 wherein the second treatment comprises a UV treatment.

10. The method of claim 1 further comprising depositing an interlevel dielectric layer over the continuous first stress liner.

11. The method of claim 1 wherein the continuous first stress liner has a smooth interface between the first and second portions of the continuous first stress liner.

12. A method of forming a device comprising:
providing a substrate having first and second regions;
depositing a single continuous first stress liner on the substrate, wherein the single continuous first stress liner has equal thickness and same material throughout the entire liner and comprises a first stress; and
forming a mask to protect a second portion of the single continuous first stress liner in the second region while leaving a first portion of the single continuous first stress liner in the first region exposed;
performing a first stress treatment selectively on the first portion of the single continuous first stress liner over the first region to convert the first stress in the first portion to a second stress;
removing the mask over the second portion of the single continuous first stress liner; and
performing a second stress treatment non-selectively on both the first and second portions of the single continuous first stress liner, wherein the second treatment converts the second stress in the first portion to a third stress.

13. The method of claim 12 wherein:
the first and second regions are first and second transistor regions for first and second type transistors;
the first type comprises p-type;
the second type comprises n-type;
the first stress comprises compressive stress;
the third stress comprises tensile stress; and
wherein the second stress is between the first and third stresses.

14. The method of claim 12 wherein:
the first and second regions are first and second transistor regions for first and second type transistors;
the first type comprises n-type;
the second type comprises p-type;
the first stress comprises tensile stress;
the third stress comprises compressive stress; and
wherein the second stress is between the first and third stresses.

15. The method of claim 12 wherein:
the first type comprises n-type, the second type comprises p-type, the first stress comprises tensile stress and the third stress comprises compressive stress; or
the first type comprises p-type, the second type comprises n-type, the first stress comprises compressive stress and the third stress comprises tensile stress; and
wherein the second stress is between the first and third stresses.

16. The method of claim 12 wherein:
the first treatment comprises implanting the first portion with stress relaxing ions; and
the second treatment comprises exposing the first and second portions of the single continuous first stress liner with UV radiation.

17. The method of claim 16 wherein the stress relaxing ions comprises Ge, Xe or a combination thereof.

18. The method of claim 12 further comprising depositing a interlevel dielectric layer over the single continuous first stress liner.

19. The method of claim 12 wherein the single continuous first stress liner has a smooth interface between its first and second portions.

20. The method of claim 12 wherein the second treatment comprises exposing the first and second portions of the single continuous first stress liner with UV radiation.

21. A method of forming a device comprising:
providing a substrate having first and second regions;
depositing a continuous stress layer on the substrate over the first and second regions, the continuous stress layer comprising a first stress; and
performing first and second stress treatments on the continuous stress layer to transform the first stress of a first portion of the continuous stress layer over the first region to a second stress and the second stress to a third stress, wherein
one of first and second treatments on the continuous stress layer is selective to the first portion of the continuous stress layer over the first region and not a second portion of the continuous stress layer over the second region, and
other of the first and second treatments on the continuous stress layer is non-selective to both the first and second regions.

22. A method of forming a device comprising:
providing a substrate having a first region;

forming a continuous first stress layer on the substrate, the continuous first stress layer comprising a first stress, the continuous first stress layer covers the substrate including the first region;

performing a first stress treatment on the continuous first stress layer to transform the first stress to a second stress, wherein the first treatment comprises a non-etch treatment; and performing a second stress treatment on the continuous first stress layer with the second stress to transform the second stress to a third stress.

23. The method of claim 22 wherein:

one of first and second treatments on the continuous first stress layer is selective to a portion of the continuous first stress layer over the first region; and other of the first and second treatments on the continuous first stress layer is a non-selective stress treatment.

24. The method of claim 22 wherein:

the first treatment on the continuous first stress layer is selective to a portion of the continuous first stress layer over the first region, and the second treatment on the continuous first stress layer is a non-selective stress treatment.

\* \* \* \* \*